United States Patent
Nicolai

(10) Patent No.: US 8,072,147 B2
(45) Date of Patent: Dec. 6, 2011

(54) LIGHTING AND/OR SIGNALLING DEVICE FOR A VEHICLE, ASSOCIATED WITH ELECTRONICS WITH A HIGH LEVEL OF INTEGRATION

(75) Inventor: Jean Marc Nicolai, Courbevoie (FR)

(73) Assignee: Valeo Vision, Bobigny (FR)

( * ) Notice: Subject to any disclaimer, the term of this patent is extended or adjusted under 35 U.S.C. 154(b) by 1179 days.

(21) Appl. No.: 11/483,162

(22) Filed: Jul. 7, 2006

(65) Prior Publication Data

US 2007/0018587 A1    Jan. 25, 2007

(30) Foreign Application Priority Data

Jul. 8, 2005    (FR) ..................... 05 07308

(51) Int. Cl.
    *B60Q 1/02*    (2006.01)
(52) U.S. Cl. ......................... 315/82; 307/10.8
(58) Field of Classification Search ............ 315/77, 315/82; 307/10.1, 10.8; 257/499, 666, 676, 257/734, 777, 784
    See application file for complete search history.

(56) References Cited

U.S. PATENT DOCUMENTS

| | | | |
|---|---|---|---|
| 5,422,435 A * | 6/1995 | Takiar et al. ................. | 174/521 |
| 5,514,935 A * | 5/1996 | Oda et al. ...................... | 315/82 |
| 5,565,743 A * | 10/1996 | Yamashita et al. ............. | 315/310 |
| 5,706,185 A | 1/1998 | Toyama et al. | |
| 5,923,125 A * | 7/1999 | Endo ............................. | 315/82 |
| 6,351,074 B1 | 2/2002 | Ito et al. | |
| 6,586,884 B2 * | 7/2003 | Leleve .......................... | 315/82 |
| 7,067,926 B2 * | 6/2006 | Yamazaki et al. ............. | 257/777 |
| 7,382,056 B2 * | 6/2008 | Chiu et al. .................... | 257/777 |
| 7,511,380 B2 * | 3/2009 | Yamazaki et al. ............. | 257/777 |
| 2003/0153122 A1 | 8/2003 | Brooks | |

FOREIGN PATENT DOCUMENTS

EP    0746186    10/2002

OTHER PUBLICATIONS

"An Innovative Technique for Packaging Power Electronic Building Blocks Using Metal Posts Interconnected Parallel Plate Structures," IEEE Transactions on Advanced Packaging, vol. 22, No. 2, May 1999, pp. 136-144, by S. Haque, K. Xing, R.L. Ling, C.T.A Suchicital, G.Q. Lu, D. J. Nelsen, D. Borojevic and F. C. Lee.

* cited by examiner

*Primary Examiner* — Thuy Vinh Tran
(74) *Attorney, Agent, or Firm* — Jacox, Meckstroth & Jenkins

(57) ABSTRACT

The device according to the invention comprises a light source and electronic supply and control. The light source electronic supply and control comprises at least one circuit comprising at least one stack of chips formed from at least two power components ($IGBT_{b1}$, $IGBT_{h1}$). According to one embodiment, the light source comprises a discharge lamp and the circuit with stacking is a DC/AC converter supplying the discharge lamp. Preferably, the discharge lamp is of xenon type and the circuit with stacking is included in an electronic ballast of the device. In another embodiment, the circuit with stacking is included in an electronic module associated with the discharge lamp and forming therewith a compact assembly.

27 Claims, 3 Drawing Sheets

LIGHTING AND/OR SIGNALLING DEVICE FOR A VEHICLE, ASSOCIATED WITH ELECTRONICS WITH A HIGH LEVEL OF INTEGRATION

BACKGROUND OF THE INVENTION

1. Field of the Invention

The invention concerns in general terms lighting and/or signalling devices, such as headlights, intended to be mounted in motor vehicles.

2. Description of the Related Art

More particularly, the invention concerns a lighting and/or signalling device for a vehicle comprising a light source and electronic supply and control means. The invention also concerns a light source capable of being mounted in such a device.

Current technical development in the automotive field is tending towards more integration of components and electronic circuits in vehicles.

In particular, as regards headlights and signalling lights, the proportion of electronics in the composition of products has increased very greatly in the last few years, in particular with the introduction of discharge lamps in headlights and light-emitting diodes in signalling lights.

In the coming years, this development can only continue in lighting and/or signalling systems in view of the progressive introduction of AFS type advanced functions, amongst which there are in particular:

- a so-called DBL (Dynamic Bending Light) function: this function makes it possible to direct a light beam produced by a light source, for example by moving a reflector with respect to the light source with which it is associated, so that, when the vehicle reaches a bend, the road is illuminated in an optimum manner;
- a so-called FBL (Fixed Bending Light) function: the purpose of this function is to progressively illuminate the verge of the road when the vehicle takes a bend; to this end, an additional light source is provided which progressively supplements the low-beam or high-beam lights during negotiation of a bend;
- a so-called DRL (Day Running Light) function: this function provides the continuous lighting of lights of the headlight device, in particular for indicating to pedestrians the presence of the moving vehicle and thus avoiding collisions with pedestrians;
- a so-called "Town Light" function. This function provides the broadening of a low-beam type beam whilst slightly reducing its range;
- a so-called "Motorway Light" function. This function provides an increase in the range of a low-beam light;
- a so-called AWL (Adverse Weather Light) function. This function provides a modification of a low-beam light beam so that the driver is not dazzled by a reflection of his own headlight;
- a so-called "Overhead Light" function. This function provides a modification of a low-beam light beam so that gantries situated high up are satisfactorily illuminated by means of the low-beam lights.

The increasing proportion of electronics in lighting and/or signalling systems is directing current research and development efforts towards a more and more intense integration of electronic circuits and in particular integration on the same substrate of power components and components dedicated to control. Besides the gain in compactness, the integration of electronic components is likely to generate the various known advantageous effects such as better performance and reliability and lower costs.

The integration of power components such as IGBT (Insulated Gate Bipolar Transistors) or MOS transistors poses particular difficulties related to the management of thermal constraints of the circuits.

There is known by the inventive entity an electronic ballast for supplying a xenon discharge lamp comprising on the same substrate four IGBT power transistors and various other analog and digital components.

This ballast according to the prior art is shown in FIG. 2 and is designated $11_{pa}$ hereinafter.

FIG. 2 shows in a top view the layout of the various chips of the ballast $11_{pa}$ on a printed circuit type substrate $SUB_{pa}$. The chips designated P1, P2, P3 and P4 are those of four IGBT power transistors forming a switching bridge of a DC/AC voltage converter which is included in the ballast $11_{pa}$. The components globally marked P6 are those of a DC/DC voltage converter and of a control circuit also included in the ballast $11_{pa}$.

Known microelectronic techniques are used to lay out the electronic components on the substrate $SUB_{pa}$ and establish the appropriate electrical connections between them.

Although this ballast of the prior art has a level of integration that is already relatively high and satisfies the various constraints, in particular those for high temperature (temperature higher than 150° C.), imposed on this type of circuit in a headlight, it is desirable today to propose new solutions enabling additional advances in the integration of electronic circuits dedicated to lighting and/or signalling systems.

SUMMARY OF THE INVENTION

According to a first aspect, the present invention provides a lighting and/or signalling device for a motor vehicle comprising a light source and electronic supply and control means, wherein the control means comprises at least one circuit comprising at least one stack of chips formed from at least two power components, and in that the circuit comprises a substrate of high temperature printed circuit type, capton type, ceramic type or lead frame type.

Correlatively, the invention also concerns a lighting and/or signalling system for a motor vehicle comprising at least two lighting and/or signalling devices and electronic supply and control means, wherein said electronic means comprise at least one circuit comprising at least one stack of chips formed from at least two power components, and in that the circuit comprises a substrate (SUB) of high temperature printed circuit type, capton type, ceramic type or lead frame type.

According to one particular embodiment, the light source comprises a discharge lamp and said circuit is a DC/AC converter supplying the discharge lamp. Preferably, the discharge lamp is of xenon type.

According to yet other particular characteristics:

- The circuit comprising at least one stack of chips is included in an electronic ballast of said device.
- The circuit comprising at least one stack of chips is included in an electronic module associated with the discharge lamp and forming therewith a compact assembly.
- The circuit comprises a switching bridge with four transistors and two stacks of chips each formed with two transistors of the same branch of the switching bridge. Preferably, the transistors are of IGBT or MOS type.
- The substrate comprises at least one thermal via at the level of at least one stack of chips.

The circuit comprises a thermal drain against which one face of the substrate comes into thermal contact. Preferably, the thermal drain is formed by a case containing the circuit.

The substrate and the thermal drain are fixed together by means of an adhesive and/or a pre-impregnated board.

The circuit also comprises electrical connection means comprising a lead frame and/or soldered conductive wires.

According to another characteristic, the stack of chips also comprises a control circuit chip stacked with the power components.

According to the embodiment of the invention, this control circuit chip can take different forms and fulfill different functions. Thus, where the stack of chips is installed in a discharge lamp ballast, the control circuit chip constructed around a microcontroller or microprocessor will provide for example the control management of the DC/DC and DC/AC converters of the ballast. Where the stack of chips is installed in an electronic module associated with a discharge lamp and forming therewith a compact assembly, the control circuit chip will provide for example all or some of the management functions of the lamp such as HDL type intelligence functions.

According to other aspects, the invention also concerns a light source capable of being mounted in a lighting and/or signalling device or system according to the invention, and a motor vehicle equipped with at least one light source or a lighting and/or signalling device according to the invention.

These and other objects and advantages of the invention will be apparent from the following description, the accompanying drawings and the appended claims.

BRIEF DESCRIPTION OF THE DRAWINGS

Other aspects and advantages of the present invention will emerge more clearly from a reading of the description of particular embodiments that will follow, this description being given by way of a non-limiting example and produced with reference to the accompanying drawings, in which.

DETAILED DESCRIPTION OF THE PREFERRED EMBODIMENTS

Figure 1:
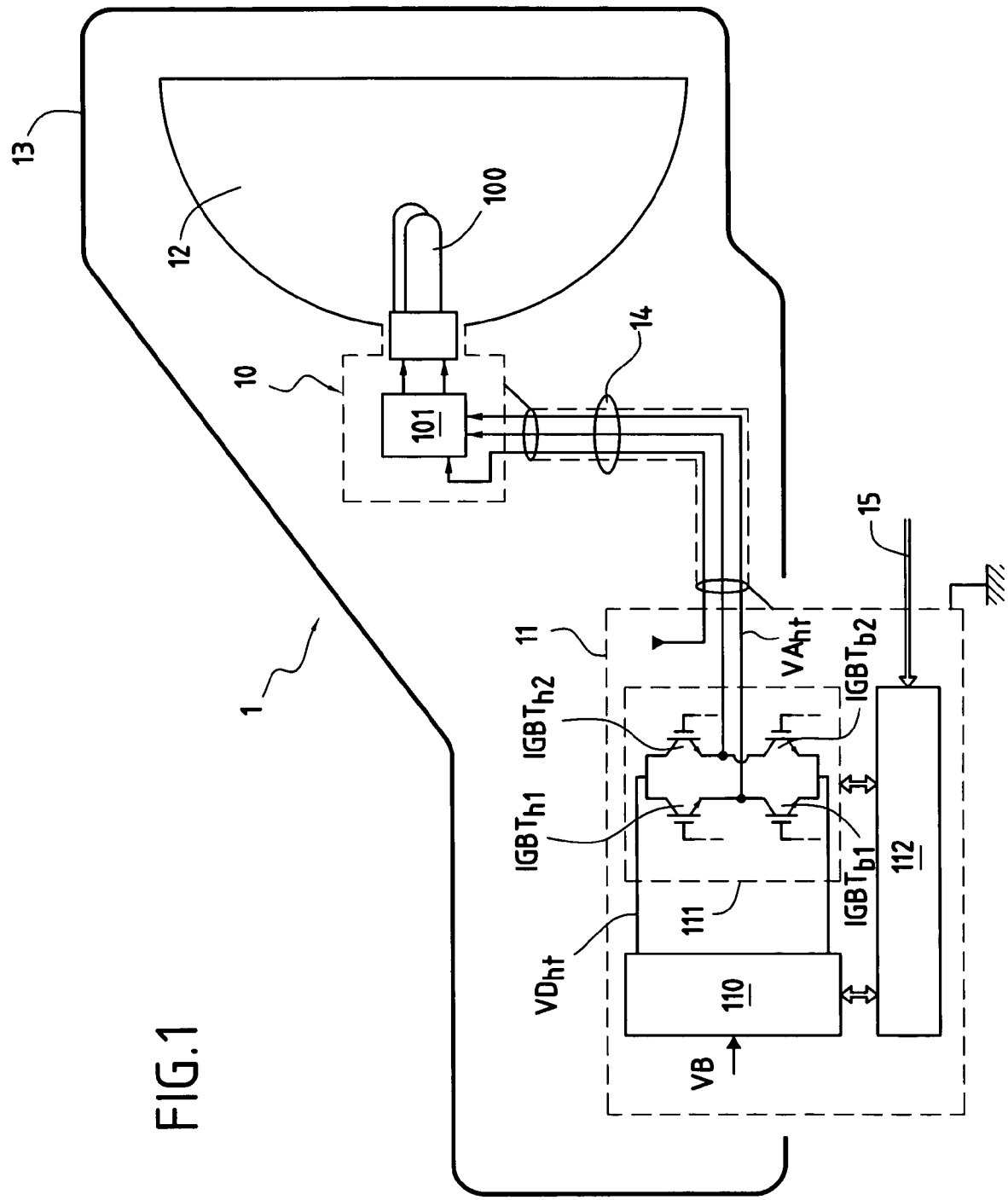
FIG. 1 shows a first particular embodiment of a headlight according to the invention in which stacks of chips are installed in a ballast of the headlight.

With reference to FIG. 1, a description is now given of a first particular embodiment, globally designated 1, of a lighting and/or signalling device such as a headlight according to the invention. In this particular embodiment, the light source is a xenon discharge lamp.

As shown in FIG. 1, the headlight 1 essentially comprises a light source 10, an electronic lamp supply module 11, a reflector 12 and a case 13 in which the above elements are assembled.

Of course, the case 13 is associated with a lens (not depicted) allowing emission to the outside of the lighting beam produced by the headlight 1.

More precisely, the light source 10 comprises a xenon discharge lamp 100 and a high-voltage (HV) ignition module 101.

The discharge lamp 100 and the HV ignition module 101 form a compact assembly that can be separated or not into two parts according to the standard used, for example D1 or D2.

The lamp supply module 11 is a device, usually designated "ballast", which provides, from a DC battery voltage VB of the vehicle, high voltages that are adapted to the type of discharge lamp used.

As shown in FIG. 1, the ballast 11 essentially comprises a DC/DC voltage converter 110, a DC/AC voltage converter 111 and a control module 112.

The DC/DC converter 110 receives as an input the DC battery voltage VB and supplies as an output a high DC voltage VDht.

The DC/AC converter 111 receives the high DC voltage VDht and delivers a high AC voltage VAht which is supplied, through a screened cable 14, to the HV ignition module 101.

The control module 112 is for example of microprocessor-based type and controls a regulated power supply for the light source 10 through adapted control of the converters 110 and 111. Conventionally, negative feed-back loops can be provided to regulate current-wise and voltage-wise the supply provided to the light source 10.

In this particular embodiment, the control module 112 is connected to an electronic control unit (not depicted) through a communication link 15 for example of LIN or CAN type. This electronic control unit, according to the solution installed in the vehicle, is for example a unit dedicated to lighting/signalling control or a central unit of the vehicle. The control module 112 thus receives commands such as a start/stop command and lighting mode commands corresponding to different possible lighting modes. These different lighting modes are for example those recommended in AFS (Advanced Front lighting System or Adaptive Front lighting System) type systems.

As shown schematically in FIG. 1, the DC/AC converter 111 comprises a high-voltage switching bridge comprising 4 IGBT type power transistors, designated IGBTh1, IGBTh2, IGBTb1 and IGBTb2. In a manner known in this type of bridge, the bridge is formed from 2 symmetrical branches, namely, the branch IGBTh1, IGBTb1 and the branch IGBTh2, IGBTb2, and is controlled as regards switching (transistor conducting or turned off) by switching control signals provided by the control module 112. According to a variant, the four power transistors are of MOS type.

In accordance with the invention, use is made of a chip stacking technique for producing the electronic circuit of the ballast 11.

This technique of producing the ballast 11 according to the invention is now described with reference to FIGS. 3 and 4.

Figure 3:
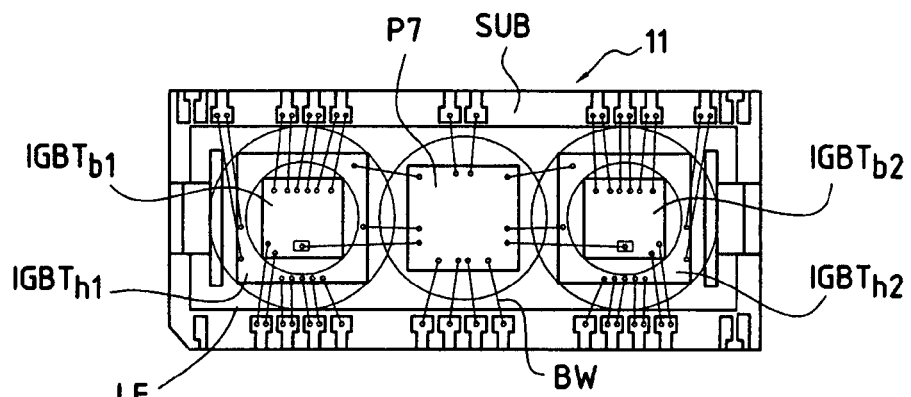
FIG. 3 shows in a top view the layout of stacks of chips in a ballast included in the headlight of FIG. 1.

As shown more particularly in FIG. 3, the transistors IGBTb1 and IGBTb2 are stacked on the transistors IGBTh1 and IGBTh2, respectively.

The stacks IGBTb1, IGBTh1 and IGBTb2, IGBTh2 are installed on the substrate SUB either side of a central area in which a chip P7 is installed. In the chip P7 there are located the other functional blocks of the ballast 11 described with reference to FIG. 1, namely, in particular the DC/DC converter 110 and the control module 112.

An electrical connection grid of "Lead Frame" type LF and a number of soldered conductive wires BW can also be seen in FIG. 3.

Figure 2:
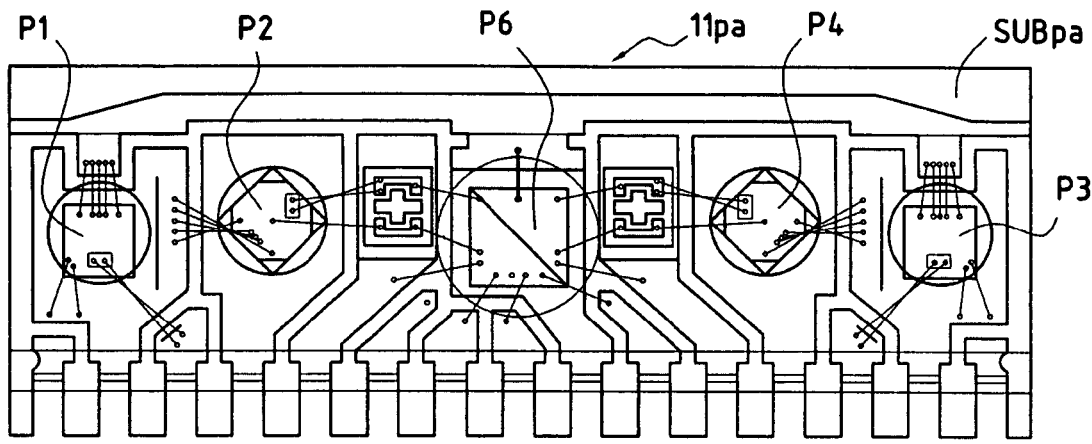
FIG. 2 shows in a top view the layout of different chips in a ballast according to the prior art.

The increased compactness enabled by the invention may be noted here, by simple comparison of the top views of FIGS. 2 and 3 which have been produced with substantially equal scales.

Figure 4:
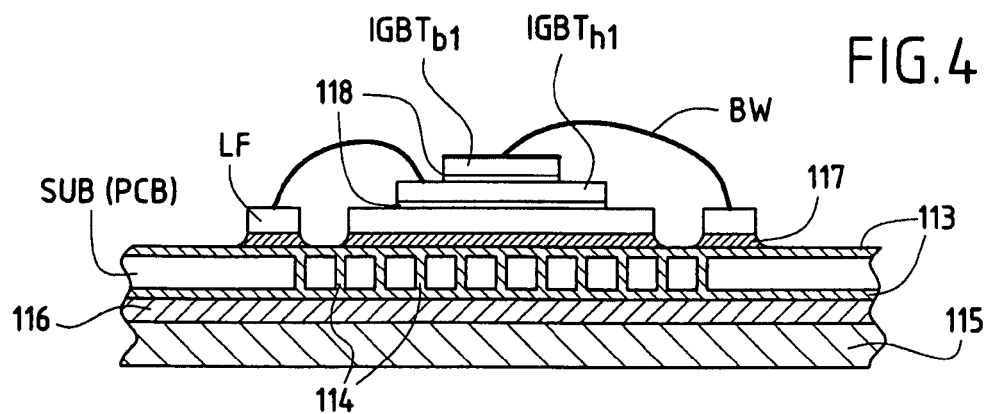
FIG. 4 is a partial view in cross-section of the ballast of FIG. 3.

FIG. 4 shows implementation details of the ballast 11 according to the invention. The cross-section shown in FIG. 4 is situated at the level of the stack IGBTb1, IGBTh1.

In this particular embodiment, the ballast 11 comprises, as the substrate SUB, a printed circuit board PCB serving as a support for installing the chips. The board PCB is produced for example from a high-temperature printed circuit of FR4 or FR5 type, or in capton for better thermal conduction.

Of course, other standards known by persons skilled in the art can be used for the board PCB and their choice will depend essentially on the application in which the invention will be used. Moreover, in a variant, the substrate SUB can be formed from a ceramic wafer or else the electronic components can be mounted directly on a connection grid in that case providing the function of the substrate SUB (so-called "lead frame" technology).

In FIG. 4, the board PCB is of double-sided type and comprises conductive parts made of copper 113 on surface parts.

A number of thermal vias 114 are made in the board PCB. The thermal vias 114 are here located in the region of the power components IGBTb1, IGBTh1 and IGBTb2, IGBTh2 and facilitate removal of the heat to a thermal drain 115.

In this particular embodiment, the thermal drain 115 is constituted by an aluminum case of the ballast 11 in which the electronic circuit is housed.

An adhesive 116 is used here to fix the board PCB, at the level of a first copper face 113, onto a bottom wall of the case 115. In other embodiments, the board PCB is assembled onto the case 115 through a thermal interface or is assembled hot through a pre-impregnated board (pre-preg).

Soldering paste 117, deposited for example by silk-screen printing, forms after heating a conductive rigid connection between conductive tracks of a second face of the board PCB and the lead frame LF.

In accordance with the invention, the stacks of chips IGBTb1, IGBTh1 and IGBTb2, IGBTh2 are next formed for example by means of the so-called "COB" (Chip On Board) technique.

An adhesive 118 is used to fix a lower face of the transistor IGBTh1, IGBTh2 onto a corresponding part of the lead frame LF and to fix a lower face of the transistor IGBTb1, IGBTb2 onto an upper face of the transistor IGBTh1, IGBTh2, respectively.

Electrical connections are then implemented by soldering conductive wires BW which connect electrical connection lands of the transistors to corresponding parts of the lead frame LF.

It should be noted, as apparent in FIG. 4, that the transistor IGBTb1, IGBFb2 only partially covers the transistor IGBTh1, IGBFh2, respectively. This characteristic permits, on the one hand, electrical connections by wires BW onto the visible upper face of the transistor IGBTh1, IGBTh2 and, on the other hand, better heat removal.

The use of a lead frame LF is a solution well adapted in power microelectronics to allow the flow of a large current. However, in certain applications of the invention, it will be possible to do without one, at least partially, and to directly solder the conductive wires BW onto copper lands on the board PCB, in particular when the space requirement constraints are relaxed and the copper tracks can take on a width sufficient for the flow of large currents.

The stack of chips implemented in accordance with the invention satisfies the high thermal constraints to which power electronics are subject in the environment of a lighting and/or signalling device such as a headlight. It is thus possible to obtain power electronics having a high level of integration and operating in an environment where the temperature can exceed 150° C.

It should be noted that the above result is obtained by virtue of the stack of chips implemented in accordance with the invention and the combination among them of the various means and techniques described with reference to FIGS. 3 and 4 which permit control of the overall thermal resistance between the chips of the power transistors and the thermal drain 115.

It should also be noted that the invention is not limited to the stacking of two power transistors, it being possible for larger stacks to be implemented without for all that departing from the scope of the invention. Thus, for example, in a variant implementation, the control module 112 (FIG. 1) is installed in a control circuit chip that is stacked with the transistors IGBTb1, IGBTh1 or IGBTb2, IGBTh2.

Figure 5:
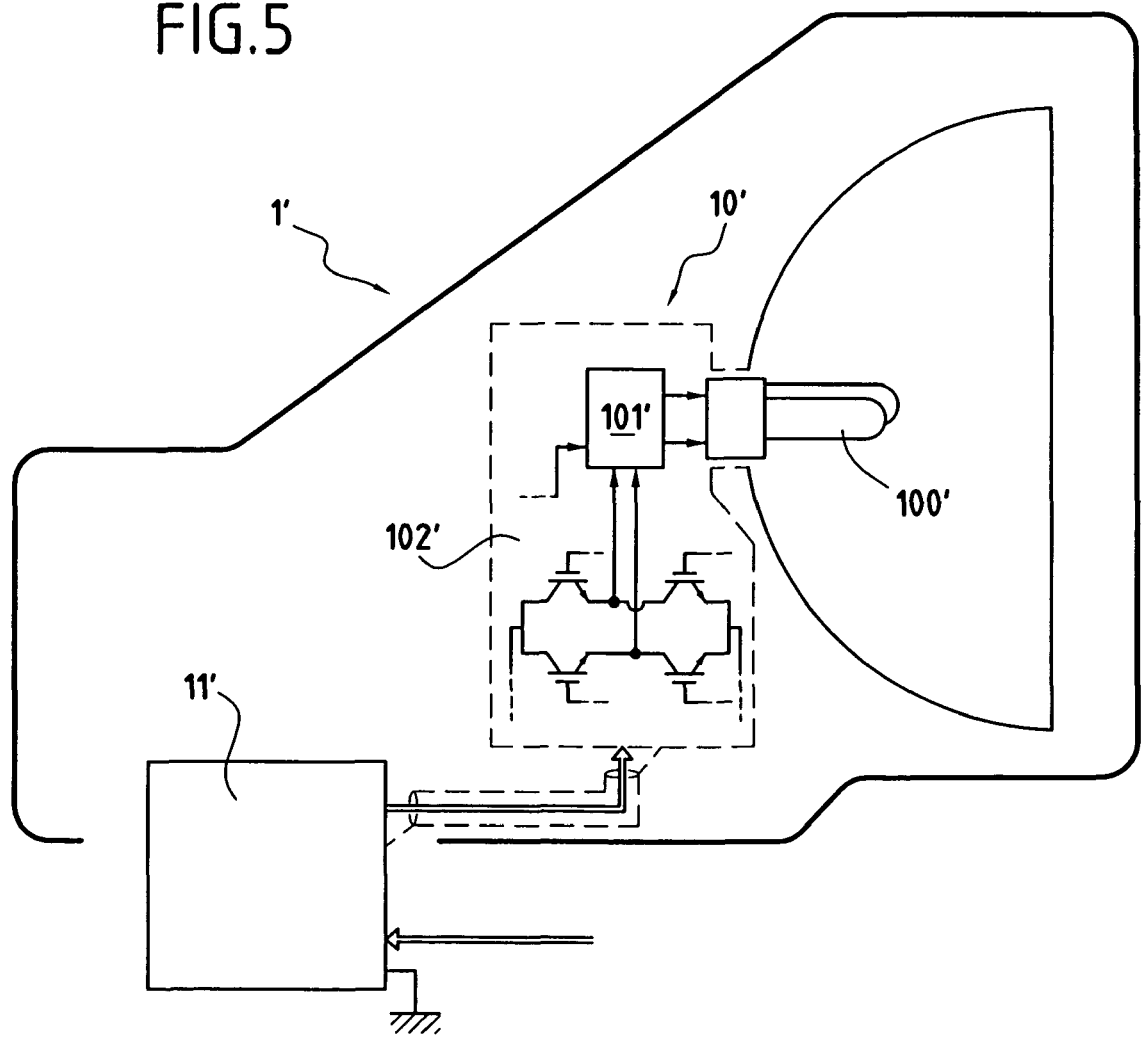
FIG. 5 shows a second particular embodiment of a headlight according to the invention in which stacks of chips are installed in a light source of the headlight.

With reference to FIG. 5, a brief description is now given of a second particular embodiment, globally designated 1', of a headlight according to the invention.

In the headlight 1', the high voltage switching bridge formed by the transistors IGBTb1, IGBTh1 and IGBTb2, IGBTh2 is integrated in an electronic module 102' associated with the discharge lamp 100'. The electronic module 102' therefore comprises the HV ignition module 101' and the switching bridge IGBTb1, IGBTh1 and IGBTb2, IGBTh2.

This second embodiment therefore uses a light source 10' incorporating, in the form of the module 102', electronics having a level of integration higher than that of the light source 10 of FIG. 1. This higher level of integration is obtained, in accordance with the invention, by virtue of the use of the chip stacking technique described above with reference to FIGS. 3 and 4. Advantageously, in this embodiment, the same substrate SUB is used for the HV ignition module and the switching bridge IGBTb1, IGBTh1 and IGBTb2, IGBTh2.

Of course, in this second embodiment, the ballast 11' of the headlight 1' has an increased compactness in view of the installation of the switching bridge IGBTb1, IGBTh1 and IGBTb2, IGBTh2 in the light source 10'.

The present invention is not limited to the details of the embodiments described here by way of example, but on the contrary extends to the modifications within the capability of persons skilled in the art, the scope of the invention being defined by the accompanying claims. Thus, for example, whilst remaining within the scope of the invention, persons skilled in the art can in certain applications use encapsulation techniques such as a technique making use of a silicone gel or some other. These encapsulation techniques can in fact prove advantageous in particular for increasing the compactness of electronic modules such as the module 102' of the light source 10'.

While the forms of apparatus herein described constitute preferred embodiments of the invention, it is to be understood that this invention is not limited to these precise forms of apparatus, and that changes may be made therein without departing from the scope of the invention which is defined in the appended claims.

What is claimed is:

1. A lighting and/or signalling device for a motor vehicle comprising at least one light source and an electronic supply and control means for controlling power supplied to said at least one light source, wherein said electronic supply and control means comprises at least one circuit comprising at least one stack of chips formed from at least two power components, wherein said at least one circuit comprises a substrate of high temperature printed circuit type, capton type, ceramic type or lead frame type;
    wherein said at least one circuit is included in at least one of an electronic ballast or an electronic module, said at least two power components comprising at least one first transistor stacked on at least one second transistor;
    said at least one first transistor being stacked directly on top of said at least one second transistor and facilitating heat removal and an electrical connection between said at least one first transistor and said at least one second transistor and also facilitates heat removal;
    said at least one first transistor only partially covering said at least one second transistor to provide a visible upper face on said at least one second transistor that is not covered by said at least one first transistor;
    said lighting and/or signalling device further comprising at least one thermal heat sink located in a region of said at least one first transistor and said at least one second transistor to facilitate removal of heat therefrom; and
    wherein said at least one first transistor and said at least one second transistor define said at least one stack of chips and each of them provide power to said at least one light source.

2. The device according to claim 1, wherein said at least one light source comprises a discharge lamp and said at least one circuit is a DC/AC converter supplying an AC voltage to said discharge lamp.

3. A device according to claim 2, wherein said discharge lamp is of xenon type.

4. A device according to claim 2, wherein said at least one circuit is included in said electronic ballast of said device.

5. A device according to claim 2, wherein said at least one circuit is included in said electronic module associated with said discharge lamp and forming therewith a compact assembly.

6. A device according to claim 2, wherein said at least one circuit comprises a switching bridge with four transistors and two stacks of chips each formed with two transistors of said four transistors situated in the same branch of said switching bridge.

7. A device according to claim 6, wherein said four transistors are of IGBT or MOS type.

8. A device according to claim 1, wherein said substrate comprises at least one thermal via at a level of said at least one stack of chips.

9. A device according to claim 8, wherein said at least one circuit also comprises a thermal drain against which one face of said substrate comes into thermal contact.

10. A device according to claim 9, wherein said thermal drain is formed by a case containing said at least one circuit.

11. A device according to claim 9, wherein said face of said substrate and said thermal drain are fixed together by means of at least one of an adhesive or a pre-impregnated board.

12. A device according to claim 1, wherein said at least one circuit also comprises a lead frame and/or soldered conductive wires.

13. A device according to claim 1, wherein at least one of said at least one stack of chips also comprises a chip stacked with said at least two power components.

14. The lighting and/or signalling device according to claim 1, wherein an electronic module is formed associated with said at least one light source, and comprised of said at least one circuit comprising said at least one stack of chips formed from said at least two power components, and in that said at least one circuit comprising said substrate of high temperature printed circuit type, capton type, ceramic type or lead frame type.

15. A motor vehicle, which comprises at least one lighting or signalling device according to claim 14.

16. A motor vehicle, which comprises at least one lighting and/or signalling device according to claim 1.

17. The lighting and/or signalling device according to claim 1, wherein said at least one light source is a discharge lamp.

18. A lighting and/or signalling system for a motor vehicle comprising at least two lighting or signalling devices and an electronic supply and control means for controlling power supplied to said at least two lighting or signaling devices, wherein said electronic supply comprises at least one circuit comprising at least one stack of chips formed from at least two power components, and in that said at least one circuit comprises a substrate of high temperature printed circuit type, capton type, ceramic type or lead frame type;
    wherein said at least one circuit is included in at least one of an electronic ballast or an electronic module, said at least two power components comprising at least one first transistor stacked on at least one second transistor;
    said at least one first transistor being stacked directly on top of said at least one second transistor and facilitating heat removal and an electrical connection between said at least one first transistor and said at least one second transistor;
    said at least one first transistor only partially covering said at least one second transistor to provide a visible upper face on said at least one second transistor that is not covered by said at least one first transistor to permit said electrical connection;
    said lighting and/or signalling device further comprising at least one thermal heat sink located in a region of said at least one first transistor and said at least one second transistor to facilitate removal of heat therefrom; and
    wherein said at least one first transistor and said at least one second transistor define said at least one stack of chips and each of them provide power to said at least one light source.

19. The lighting and/or signalling device according to claim 18, wherein said at least two lighting or signalling devices are discharge lamps.

20. A motor vehicle lighting and/or signaling system for use on a motor vehicle, comprising:
    a light source;
    a ballast for controlling said light source, said ballast comprising a light source control circuit coupled to said light source, said light source control circuit comprising:
    at least two power components situated in stacked relationship relative to each other, said light source control circuit further comprising a substrate of at least one of a high temperature printed circuit substrate, capton substrate, ceramic substrate or lead frame substrate;
    wherein and said light source control circuit is included in at least one of an electronic ballast or an electronic module, said at least two power components comprising at least one first transistor stacked on at least one second transistor;
    said at least one first transistor being stacked directly on top of said at least one second transistor and facilitating heat removal and an electrical connection between said at least one first transistor and said at least one second transistor;
    said at least one first transistor only partially covering said at least one second transistor to provide a visible upper face on said at least one second transistor that is not covered by said at least one first transistor to permit said electrical connection;

said lighting and/or signalling device further comprising at least one thermal heat sink located in a region of said at least one first transistor and said at least one second transistor to facilitate removal of heat therefrom; and wherein said at least one first transistor and said at least one second transistor define said at least one stack of chips and each of them provide power to said at least one light source.

21. The motor vehicle lighting and/or signaling system according to claim 20, wherein said light source comprises a discharge lamp and said light source control circuit is a DC/AC converter supplying an AC voltage to said discharge lamp.

22. A motor vehicle lighting and/or signaling system according to claim 21, wherein said discharge lamp is of xenon type.

23. A motor vehicle lighting and/or signaling system according to claim 21, wherein said light source control circuit is included in an electronic ballast of said system.

24. A motor vehicle lighting and/or signaling system according to claim 21, wherein said light source control circuit is included in an electronic module associated with said discharge lamp and forming therewith a compact assembly.

25. A motor vehicle lighting and/or signaling system according to claim 21, wherein said light source control circuit comprises a switching bridge with four transistors and two stacks of chips each formed with two transistors of said four transistors situated in the same branch of said switching bridge.

26. A motor vehicle lighting or signaling control method, comprising the steps of:

providing a discharge lamp;

providing a plurality of components forming a control circuit of a ballast for controlling operation of said discharge lamp; said plurality of components comprising a plurality of power components; and providing said plurality of power components in a stack of chips, respectively;

wherein said control circuit is included in at least one of an electronic ballast or an electronic module associated with said discharge lamp, said plurality of components comprising at least one first transistor stacked on at least one second transistor;

said at least one first transistor being stacked directly on top of said at least one second transistor and facilitating heat removal and an electrical connection between said at least one first transistor and said at least one second transistor;

said at least one first transistor only partially covering said at least one second transistor to provide a visible upper face on said at least one second transistor that is not covered by said at least one first transistor to permit said electrical connection;

said lighting and/or signalling device further comprising at least one thermal heat sink located in a region of said at least one first transistor and said at least one second transistor to facilitate removal of heat therefrom; and wherein said at least one first transistor and said at least one second transistor define said at least one stack of chips and each of them provide power to said at least one light source.

27. The motor vehicle lighting or signaling control method according to claim 26, wherein said stack of chips extends generally vertically.

* * * * *